(12) United States Patent
Hu et al.

(10) Patent No.: US 10,321,561 B2
(45) Date of Patent: Jun. 11, 2019

(54) FLEXIBLE PRINTED CIRCUIT BOARD, PRINTED CIRCUIT BOARD STRUCTURE AND METHOD FOR MANUFACTURING FLEXIBLE PRINTED CIRCUIT BOARD

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Xian-Qin Hu, Guangdong (CN); Ming-Jaan Ho, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN)

( * ) Notice: Subject to any disclaimer, the term of this patent is extended or adjusted under 35 U.S.C. 154(b) by 8 days.

(21) Appl. No.: 15/643,121

(22) Filed: Jul. 6, 2017

(65) Prior Publication Data

US 2018/0139841 A1 May 17, 2018

(30) Foreign Application Priority Data

Nov. 15, 2016 (CN) .......................... 2016 1 1005379

(51) Int. Cl.
*H05K 1/02* (2006.01)
*H05K 1/11* (2006.01)
(Continued)

(52) U.S. Cl.
CPC ............ *H05K 1/0281* (2013.01); *H05K 1/112* (2013.01); *H05K 1/118* (2013.01); *H05K 1/144* (2013.01);
(Continued)

(58) Field of Classification Search
CPC ........ H05K 1/113; H05K 1/144; H05K 1/189; H05K 2201/09827
See application file for complete search history.

(56) References Cited

U.S. PATENT DOCUMENTS 5,661,267 A * 8/1997 Isaak ................... H01L 25/0655
174/250
6,753,600 B1 * 6/2004 Ho ...................... H01L 23/3128
257/687
(Continued)

*Primary Examiner* — William H. Mayo, III
*Assistant Examiner* — Hiram E Gonzalez
(74) *Attorney, Agent, or Firm* — ScienBiziP, P.C.

(57) ABSTRACT

A flexible printed circuit board (PCB), a method for manufacturing the flexible PCB, and a PCB structure having the flexible PCB are disclosed. A flexible printed circuit board includes a first conductive pattern layer, a second conductive pattern layer, a plurality of first conductive pillars, and a plurality of second conductive pillars. Each of the plurality of first conductive pillars electrically connects to the first conductive pattern layer and is spaced from the second conductive pattern layer, and a plurality of second conductive pillars electrically connects to the second conductive pattern layer and is spaced from the first conductive pattern layer. The plurality of first conductive pillars and the plurality of second conductive pillars are exposed from one surface of the flexible printed circuit board to form a plurality of electrical contact pads.

11 Claims, 7 Drawing Sheets

(51) Int. Cl.

| | | |
|---|---|---|
| *H05K 3/40* | (2006.01) | |
| *H05K 1/18* | (2006.01) | |
| *H05K 1/14* | (2006.01) | |
| *H05K 3/22* | (2006.01) | |
| *H05K 3/24* | (2006.01) | |
| *H05K 3/42* | (2006.01) | |

(52) U.S. Cl.
CPC ............ *H05K 1/181* (2013.01); *H05K 1/189* (2013.01); *H05K 3/22* (2013.01); *H05K 3/4007* (2013.01); *H05K 3/4038* (2013.01); *H05K 1/115* (2013.01); *H05K 1/116* (2013.01); *H05K 3/244* (2013.01); *H05K 3/428* (2013.01); *H05K 2201/041* (2013.01); *H05K 2201/097* (2013.01); *H05K 2201/09054* (2013.01); *H05K 2201/09454* (2013.01); *H05K 2201/09509* (2013.01); *H05K 2201/09709* (2013.01); *H05K 2201/09827* (2013.01); *H05K 2201/10689* (2013.01); *H05K 2201/2009* (2013.01)

(56) References Cited

U.S. PATENT DOCUMENTS

| | | | |
|---|---|---|---|
| 7,514,298 B2 * | 4/2009 | Tanaka | H01L 23/49816 257/692 |
| 2016/0021742 A1 * | 1/2016 | Johansson | H05K 3/363 174/254 |
| 2016/0327220 A1 * | 11/2016 | Tischler | H01L 23/4985 |
| 2017/0367185 A1 * | 12/2017 | Roessler | H05K 1/0298 |

* cited by examiner

FLEXIBLE PRINTED CIRCUIT BOARD, PRINTED CIRCUIT BOARD STRUCTURE AND METHOD FOR MANUFACTURING FLEXIBLE PRINTED CIRCUIT BOARD

CROSS-REFERENCE TO RELATED APPLICATIONS

This application claims priority to Chinese Patent Application No. 201611005379.0 filed on Nov. 15, 2016, the contents of which are incorporated by reference herein.

FIELD

The present disclosure relates to a flexible printed circuit board.

BACKGROUND

A distribution density of pads on a flexible printed circuit board is increased when sizes and thicknesses of electronic products decrease. A substrate with chip on film (COF) is used to connect to a screen integrated circuit driving chip, for the substrate with chip on film having contact pads in a high-density distribution.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
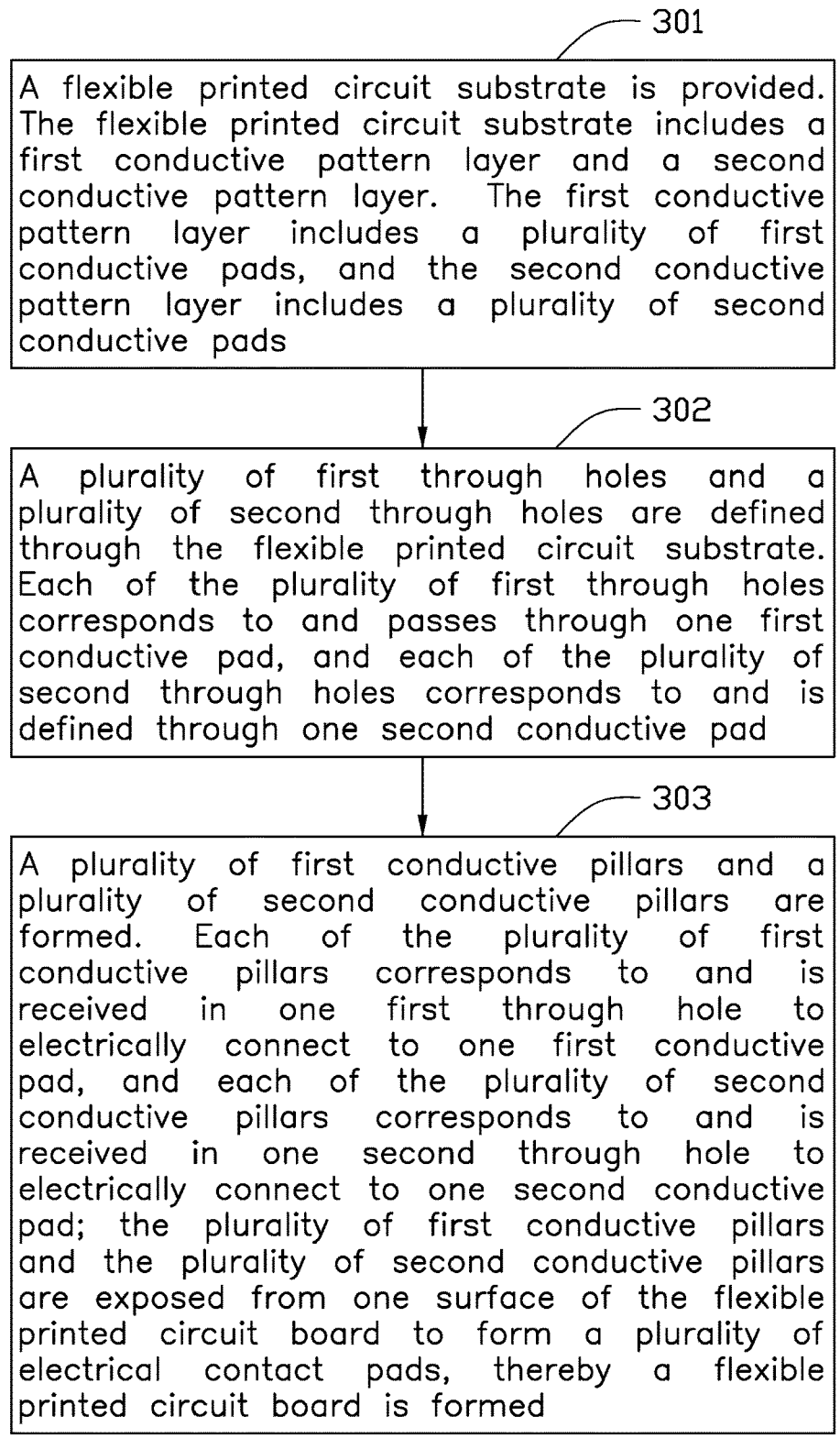
FIG. 1 is a flow chart of a method for forming a flexible printed circuit board in accordance with the first exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "comprising," when utilized, means "including, but not necessarily limited to"; it specifically indicates open-ended inclusion or membership in the so-described combination, group, series, and the like.

FIG. 1 illustrates a flow chart of a method for forming a flexible printed circuit board 10 in accordance with the first exemplary embodiment of the present disclosure. The example method is provided by way of example, as there are a variety of ways to carry out the method. The method described below can be carried out using the configurations illustrated in FIGS. 2-12, for example, and various elements of these figures are referenced in explaining example method. Each block shown in FIG. 1 represents one or more processes, methods, or subroutines, carried out in the example method. Additionally, the illustrated order of blocks is by example only and the order of the blocks can change. The example method can begin at block 301.

At block 301, a flexible printed circuit substrate is provided. The flexible printed circuit substrate includes a first conductive pattern layer and a second conductive pattern layer. The first conductive pattern layer includes a plurality of first conductive pads, and the second conductive pattern layer includes a plurality of second conductive pads.

At block 302, a plurality of first through holes and a plurality of second through holes are defined through the flexible printed circuit substrate. Each of the plurality of first through holes corresponds to and passes through one first conductive pad, and each of the plurality of second through holes corresponds to and is defined through one second conductive pad.

At block 303, a plurality of first conductive pillars and a plurality of second conductive pillars are formed. Each of the plurality of first conductive pillars corresponds to and is received in one first through hole to electrically connect to one first conductive pad, and each of the plurality of second conductive pillars corresponds to and is received in one second through hole to electrically connect to one second conductive pad; the plurality of first conductive pillars and the plurality of second conductive pillars are exposed from one surface of the flexible printed circuit board to form a plurality of electrical contact pads, thereby a flexible printed circuit board is formed.

Figure 2:
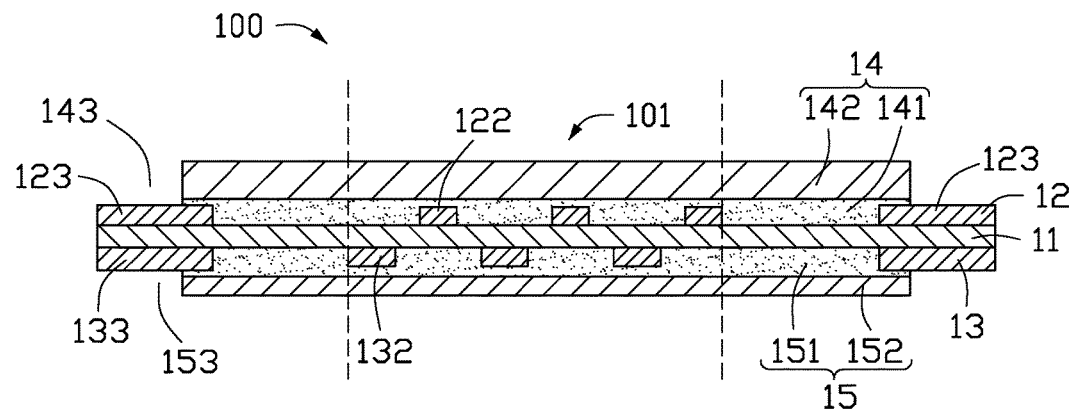
FIG. 2 is a cross-sectional view of a flexible printed circuit substrate according to the first exemplary embodiment.
Figure 3:
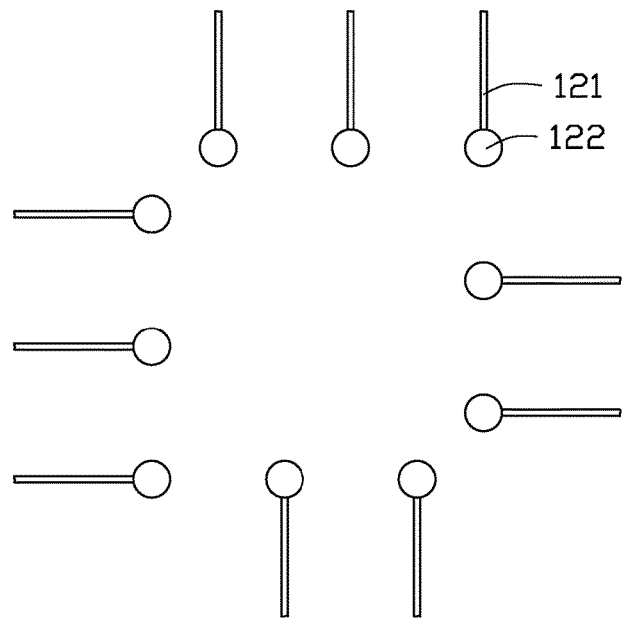
FIG. 3 is a top view of a portion of a first conductive pattern layer of the flexible printed circuit substrate as shown in FIG. 2.
Figure 4:
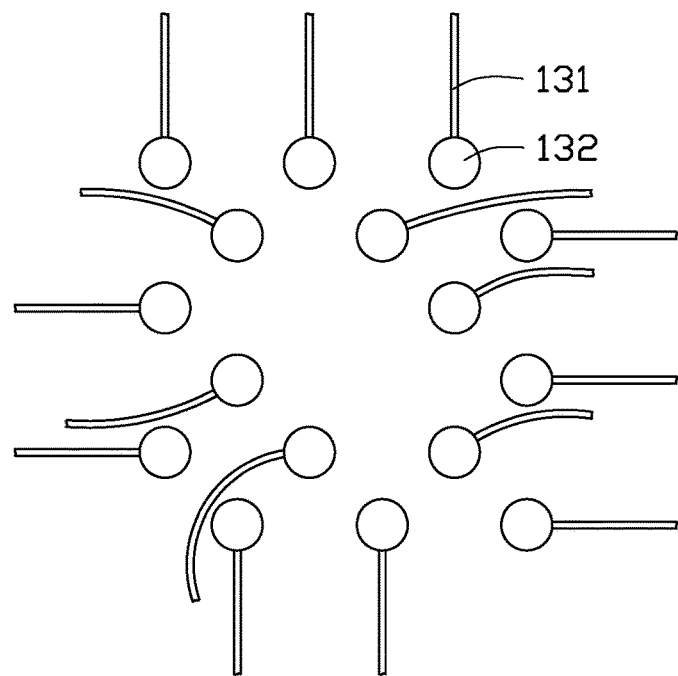
FIG. 4 is a bottom view of a portion of a second conductive pattern layer of the flexible printed circuit substrate as shown in FIG. 2.

At block 301, referring to FIGS. 2-4, a flexible printed circuit substrate 100 is provided. The flexible printed circuit substrate 100 includes a base layer 11, a first conductive pattern layer 12 formed on a surface of the base layer, a second conductive pattern layer 13 formed on an opposite surface of the base layer 11, a first covering layer 14 formed on a side of the first conductive pattern layer 12, and a second covering layer 15 formed on a side of the second conductive pattern layer 15.

In the exemplary embodiment, the base layer 11 is made of insulating material and can be chosen from polyimide, teflon, polyamide, polymethylmethacrylate, polycarbonate, polyethylene terephtalate, polyamide polyethylene-terephthalatecopolymer or any combination.

The flexible printed circuit substrate 100 defines at least one mounting area 101 for mounting an electronic element. In the exemplary embodiment, the flexible printed circuit substrate 100 defines one mounting area 101 on center position whereof.

The first conductive pattern layer 12 includes a plurality of first conductive wires 121, at least one first conductive pad group (not shown), and at least one first conductive finger group (not shown). Each of the first conductive pad group corresponds to and is aligned with one mounting area 101. Each of the first conductive pad group includes a plurality of first conductive pads 122 spaced from each other and arranged in an array. Each of the first conductive pads 122 corresponds to and electrically connects to one first conductive wire 121. Each of the first conductive finger group includes a plurality of first conductive fingers 123 spaced from each other and arranged in an array. Each of the first conductive fingers 123 corresponds to and electrically connects to one first conductive wire 121.

In the exemplary embodiment, a shape of each of the first conductive pads 122 is round, and a shape of each of the first conductive fingers 123 is square.

In the exemplary embodiment, there are two first conductive finger groups on each end portion of the flexible printed circuit substrate 100 and one first conductive pad group on center portion of the flexible printed circuit substrate 100.

The second conductive pattern layer 13 includes a plurality of second conductive wires 131, at least one second conductive pad group (not shown), and at least one second conductive finger group (not shown). Each second conductive pad group corresponds to and is aligned with one mounting area 101. Each second conductive pad group includes a plurality of second conductive pads 132 spaced from each other and arranged in an array. Each of the second conductive pads 132 corresponds to and electrically connects to one second conductive wire 131. Each of the second conductive finger group includes a plurality of second conductive fingers 133 spaced from each other and arranged in an array. Each of the second conductive fingers 133 corresponds to and electrically connects to one second conductive wire 121.

In the exemplary embodiment, a shape of each of the second conductive pads 132 is round, and a shape of each of the second conductive fingers 133 is square.

In the exemplary embodiment, there are two second conductive finger groups on each end portion of the flexible printed circuit substrate 100 and one second conductive pad group on center portion of the flexible printed circuit substrate 100.

Vertical projections of the plurality of first conductive pads 122 and vertical projections of the plurality of second conductive pads 132 on the base layer 11 are spaced from each other, thus the plurality of first conductive pads 122 and the plurality of second conductive pads 132 do not overlap with each other.

The first covering layer 14 includes a first adhesive layer 141 adhered on the base layer 11 and a first film layer 142 adhering to the first adhesive layer 141. The second covering layer 15 includes a second adhesive layer 151 adhered on the base layer 11 and a second film layer 152 adhered to the second adhesive layer 151. A surface of the first film layer 142 away from the first adhesive layer 141 is a mounting surface 102.

In the exemplary embodiment, a thickness of the first covering layer 14 is larger than that of the second covering layer 15.

In the exemplary embodiment, a thickness of the first film layer 142 is larger than that of the second film layer 152.

In other exemplary embodiment, the first adhesive layer 141 and the second adhesive layer 151 can be omitted.

The first covering layer 14 defines at least one first opening 143 to expose the plurality of first conductive fingers 123. The second covering layer 15 defines at least one second opening 153 to expose the plurality of second conductive fingers 133.

In the exemplary embodiment, there are two first openings 143 and two second openings 153.

Figure 5:
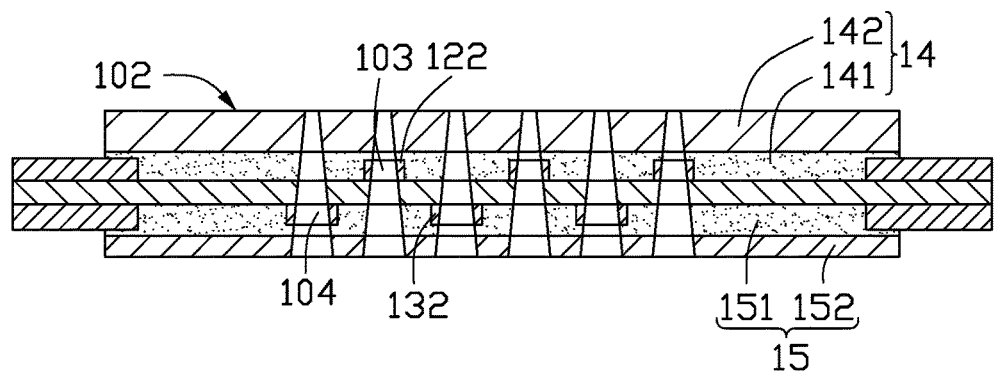
FIG. 5 is a cross-sectional view of a plurality of first through holes and a plurality of second through holes defined through the flexible printed circuit substrate as shown in FIG. 2.

At block 302, referring to FIG. 5, a plurality of first through holes 103 and a plurality of second through holes 104 are defined through the flexible printed circuit substrate 100.

Each of the plurality of first through holes 103 corresponds to and is defined through one first conductive pad 122. Each of the plurality of second through holes 104 corresponds to and is defined through one second conductive pad 132.

In the exemplary embodiment, the plurality of first through holes 103 and the plurality of second through holes 104 are formed by a laser process, and a cross sectional shape of each of the plurality of first through holes 103 and a cross sectional shape of each of the plurality of second through holes 104 are trapezoidal. Each of the plurality of first through holes 103 and each of the plurality of second through holes 104 have bigger openings on the second covering layer 15 than on the first covering layer 14. A diameter of each of the plurality of first through holes 103 and a diameter of each of the plurality of second through holes 104 decrease along a direction from the second covering layer 15 to the first covering layer 14.

Preferably, a diameter of each of the plurality of first through holes 103 on the first covering layer 14 and a diameter of each of the plurality of second through holes 104 on the first covering layer 14 are in a range from about 5 micrometers to about 15 micrometers.

Preferably, a thickness of the flexible printed circuit substrate 100 is less than or equal to 75 micrometers.

Figure 6:
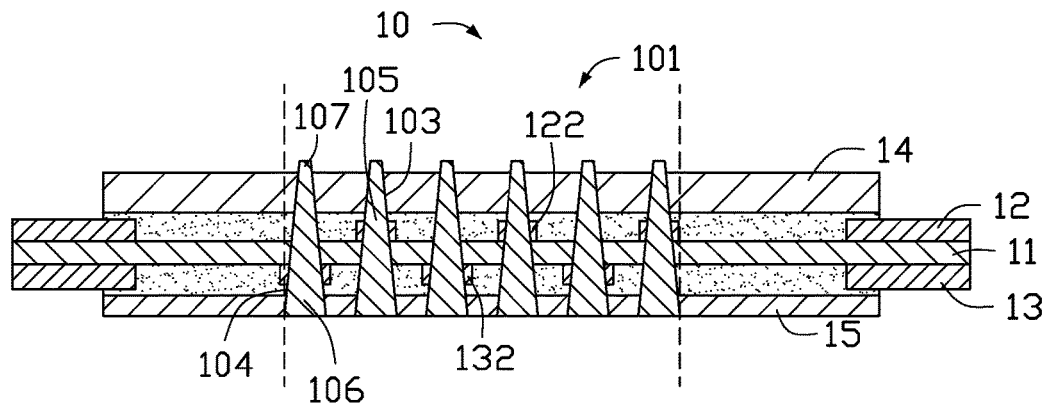
FIG. 6 is cross-sectional view of a plurality of first conductive pillars respectively received in the plurality of first through holes and a plurality of second conductive pillars respectively received in the plurality of second through holes, to form a flexible printed circuit board.
Figure 7:
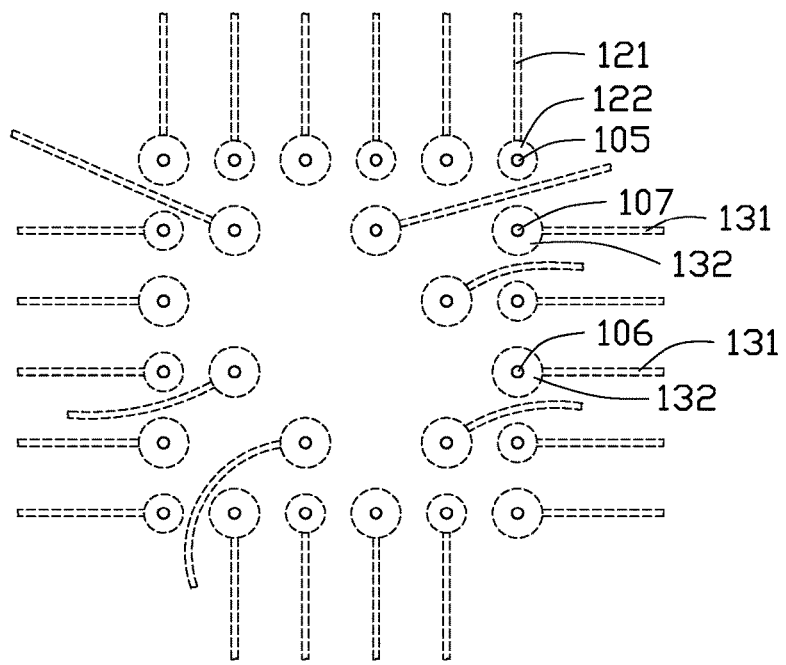
FIG. 7 is a top view of the flexible printed circuit board as shown in FIG. 6.

At block 303, referring to FIGS. 6-7, a plurality of first conductive pillars 105 and a plurality of second conductive pillars 106 are formed, thereby a flexible printed circuit board 10 is formed.

Each of the plurality of first conductive pillars 105 corresponds to and is received in one first through hole 103, and each of the plurality of second conductive pillars 106 corresponds to and is received in one second through hole 104.

Each of the plurality of first conductive pillars 105 corresponds to and electrically connects to one first conductive pad 122, and each of the plurality of second conductive pillars 106 corresponds to and electrically connects to one second conductive pad 132. The plurality of first conductive pillars 105 is spaced from the second conductive wire 131. The plurality of second conductive pillars 106 is spaced from the first conductive wire 121. The plurality of first conductive pillars 105 and the plurality of second conductive pillars 106 being exposed from one surface of the flexible printed circuit board 10 to form a plurality of electrical contact pads 107.

In the exemplary embodiment, the plurality of first conductive pillars 105 and the plurality of second conductive pillars 106 are formed by an electroplating process.

In the exemplary embodiment, one end of each of the plurality of first conductive pillars 105 and one end of each of the plurality of second conductive pillars 106 are all coplanar to the surface of the second covering layer 15 away from the first covering layer 14, and another end of each of the plurality of first conductive pillars 105 and another end of each of the plurality of second conductive pillars 106 protrude from the surface of the first covering layer 14 away from the second covering layer 15. Protruding portions of the plurality of first conductive pillars 105 and protruding portions of the plurality of second conductive pillars 106 form the plurality of electrical contact pads 107.

In the exemplary embodiment, a diameter of each of the plurality of first conductive pillars 105 and a diameter of each of the plurality of second conductive pillars 106 decrease along a direction from the second covering layer 15 to the first covering layer 14.

In the exemplary embodiment, each height of each of the plurality of first conductive pillars 105 protruding from the surface of the first covering layer 14 and each height of each of the plurality of second conductive pillars 106 protruding from the surface of the first covering layer 14 are in a range from about 2 micrometers to about 10 micrometers.

In other exemplary embodiments, the other end of each of the plurality of first conductive pillars 105 and the other end of each of the plurality of second conductive pillars 106 can be coplanar with or depressed from the surface of the first covering layer 14 away from the second covering layer 15.

In other embodiments, a plated tin layer (not shown) or a plated gold layer (not shown) can be formed on surfaces of the plurality of electrical contact pads 107, the plurality of first conductive fingers 123, and the plurality of second conductive fingers 133.

Figure 8:
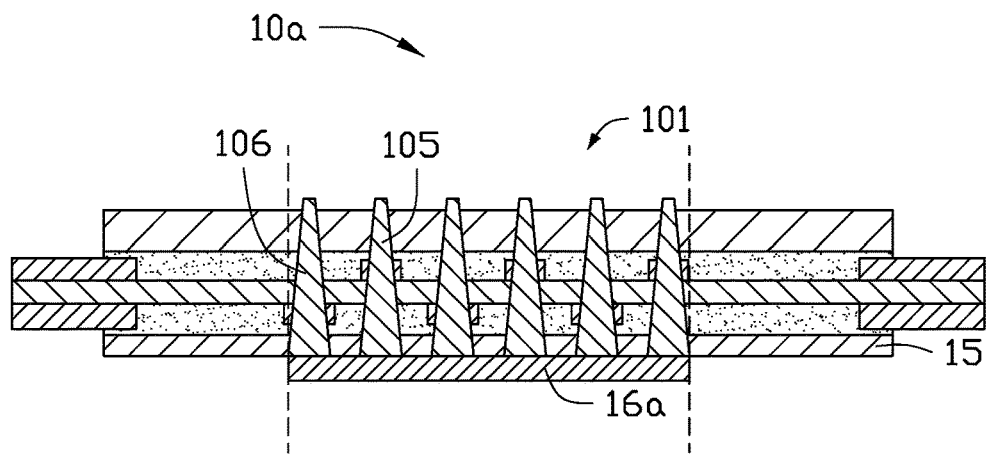
FIG. 8 is a cross-sectional view of a stiffener adhered on the second covering layer to cover one end of each first conductive pillars and one end of each second conductive pillars as shown in FIG. 6.

In a second exemplary embodiment, a method for forming a flexible printed circuit board 10a is provided. The method in the second exemplary embodiment is similar to the method in the first exemplary embodiment. The differences include that: as shown in FIG. 8, after the plurality of first conductive pillars 105 and the plurality of second conductive pillars 106 are formed, a stiffener 16a is adhered on the second covering layer 15 to cover at least the mounting area 101, thereby, covering one end of each first conductive pillar 105 and one end of each second conductive pillar 106.

The stiffener 16a can be made of metal or resin. When the stiffener 16a is made of resin, it can be made of polyimide, teflon, polyamide, polymethylmethacrylate, polycarbonate, polyethylene terephtalate, polyamide polyethylene-terephthalatecopolymer or a combination.

Figure 9:
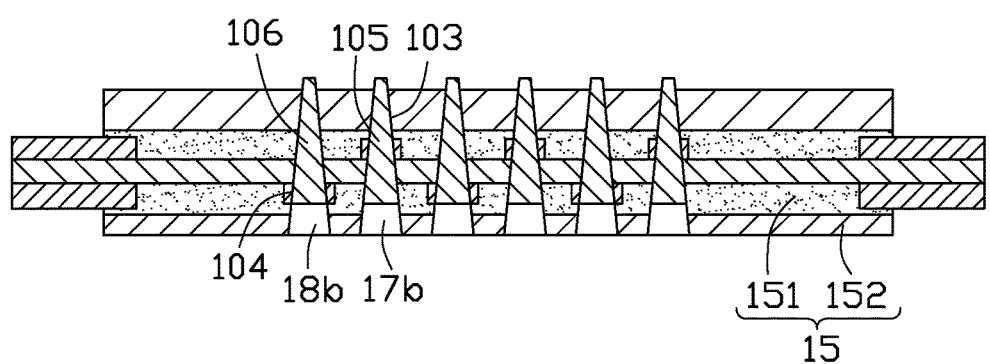
FIG. 9 is a cross-sectional view of a plurality of first grooves defined by removing a portion of each first conductive pillar on the second covering layer side, and a plurality of second grooves defined by removing a portion of each second conductive pillar 106 on the second covering layer side as shown in FIG. 8.
Figure 10:
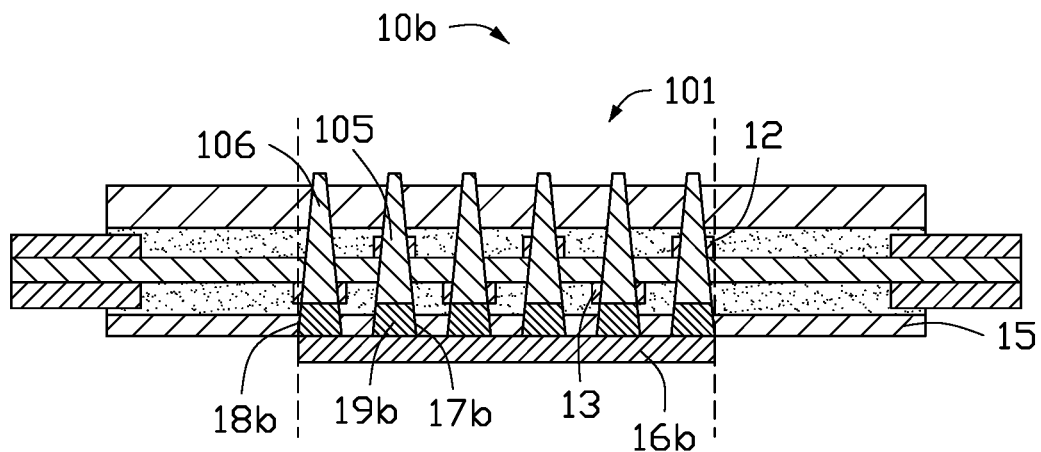
FIG. 10 is a cross-sectional view of a stiffener adhered on the second covering layer to cover the plurality of first grooves and the plurality of second grooves as shown in FIG. 9.

In a third exemplary embodiment, a method for forming a flexible printed circuit board 10b is provided. The method in the third exemplary embodiment is similar to the method in the first exemplary embodiment. The differences include that: as shown in FIG. 9, after the plurality of first conductive pillars 105 and the plurality of second conductive pillars 106 are formed, a plurality of first grooves 17b are defined by removing a portion of each first conductive pillar 105 on the second covering layer 15 side, and a plurality of second grooves 18b are defined by removing a portion of each second conductive pillar 106 on the second covering layer 15 side; then, as shown in FIG. 10, an insulating radiating material 19b is infilled into the plurality of first grooves 17b and the plurality of second grooves 18b, a stiffener 16b is adhered on the second covering layer 15 to cover the at least one mounting area 101, thereby, covering the insulating radiating material 19b.

The plurality of first grooves 17b and the plurality of second grooves 18b are all defined from the second covering layer 15 to a surface of the second conductive pattern layer 13 away from the first conductive pattern layer 12. The plurality of first grooves 17b and the plurality of second grooves 18b can be formed by a chemical etching process or a laser process.

Figure 11:
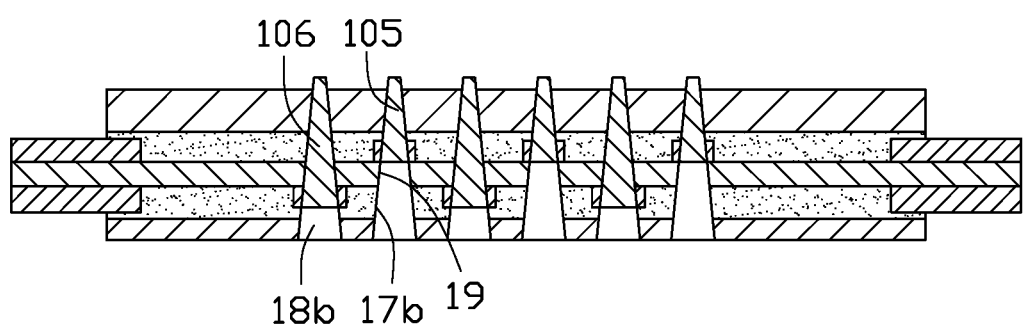
FIG. 11 is a cross-sectional view of a plurality of third grooves defined to be in air communication with the plurality of first grooves as shown in FIG. 8.
Figure 12:
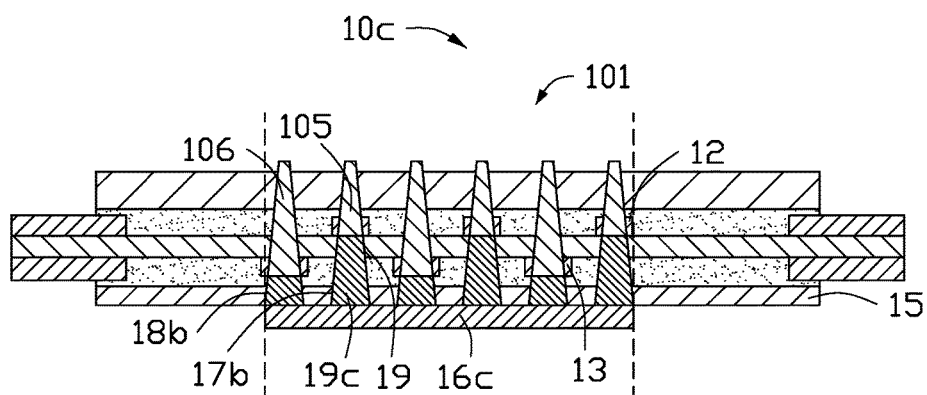
FIG. 12 is a cross-sectional view of a stiffener adhered on the second covering layer to cover the plurality of first grooves and the plurality of second grooves as shown in FIG. 11.

In a fourth exemplary embodiment, a method for forming a flexible printed circuit board 10c is provided. The method in the fourth exemplary embodiment is similar to the method in the third exemplary embodiment. The differences include that: as shown in FIG. 11, a plurality of third grooves 19b are defined by removing a portion of each first conductive pillar 105 from the surface of the second conductive pattern layer 13 away from the first conductive pattern layer 12 to a surface of the first conductive pattern layer 12 near the second conductive pattern layer 13. Each of the plurality of third grooves 19b corresponds to and is in air communications with one of the plurality of first grooves 17b; then, as shown in FIG. 12, an insulating radiating material 19c is infilled into the plurality of first grooves 17b, the plurality of second grooves 18b, and the plurality of third grooves 19b, and a stiffener 16c is adhered on the second covering layer 15 to cover at least the mounting area 101, thereby, covering insulating radiating material 19c.

The plurality of third grooves 19b can also be formed by a chemical etching process or a laser process.

In a fifth exemplary embodiment, as shown in FIGS. 6-7, a flexible printed circuit board 10 is illustrated. The flexible printed circuit board 10 includes a base layer 11, a first conductive pattern layer 12 formed on a surface of the base layer 11, a second conductive pattern layer 13 formed on an opposite surface of the base layer 11, a first covering layer 14 formed on a side of the first conductive pattern layer 12, and a second covering layer 15 formed on a side of the second conductive pattern layer 15.

In the exemplary embodiment, the base layer 11 is made of insulating material and can be chose from polyimide, teflon, polyamide, polymethylmethacrylate, polycarbonate, polyethylene terephtalate, polyamide polyethylene-terephthalatecopolymer or any combination.

The flexible printed circuit board 10 defines at least one mounting area 101 for mounting an electronic element. In the exemplary embodiment, the flexible printed circuit board 10 defines one mounting area 101 on a center position whereof.

The first conductive pattern layer 12 includes a plurality of first conductive wires 121, at least one first conductive pad group (not shown), and at least one first conductive finger group (not shown). Each first conductive pad group corresponds to and is aligned with one mounting area 101. Each first conductive pad group includes a plurality of first conductive pads 122 spaced from each other and arranged in an array. Each of the first conductive pads 122 corresponds to and electrically connects to one first conductive wire 121. Each first conductive finger group includes a plurality of first conductive fingers 123 spaced from each other and arranged in an array. Each of the first conductive fingers 123 corresponds to and electrically connects to one first conductive wire 121.

In the exemplary embodiment, a shape of each first conductive pad 122 is round, and a shape of each first conductive finger 123 is square.

In the exemplary embodiment, there are two first conductive finger groups on each end portion of the flexible printed circuit board 10 and one first conductive pad group on center portion of the flexible printed circuit substrate 100.

The second conductive pattern layer 13 includes a plurality of second conductive wires 131, at least one second conductive pad group (not shown), and at least one second conductive finger group (not shown). Each second conductive pad group corresponds to and is aligned with one mounting area 101. Each second conductive pad group includes a plurality of second conductive pads 132 spaced from each other and arranged in an array. Each of the second conductive pads 132 corresponds to and electrically connects to one second conductive wire 131. Each second conductive finger group includes a plurality of second conductive fingers 133 spaced from each other and arranged in an array. Each of the second conductive fingers 133 corresponds to and electrically connects to one second conductive wire 121.

In the exemplary embodiment, a shape of each of the second conductive pads 132 is round, and a shape of each of the second conductive fingers 133 is square.

In the exemplary embodiment, there are two second conductive finger groups on each end portion of the flexible printed circuit board 10 and one second conductive pad group on center portion of the flexible printed circuit substrate 100.

Vertical projections of the plurality of first conductive pads 122 and vertical projections of the plurality of second conductive pads 132 on the base layer 11 are spaced from each other, thus the plurality of first conductive pads 122 and the plurality of second conductive pads 132 do not overlap with each other.

The first covering layer 14 includes a first adhesive layer 141 adhered on the base layer 11 and a first film layer 142 adhered to the first adhesive layer 141. The second covering layer 15 includes a second adhesive layer 151 adhered on the base layer 11 and a second film layer 152 adhered to the second adhesive layer 151. A surface of the first film layer 142 away from the first adhesive layer 141 is a mounting surface 102.

In the exemplary embodiment, a thickness of the first film layer 142 is larger than that of the second film layer 152.

The first covering layer 14 defines at least one first opening 143 to expose the plurality of first conductive fingers 123. The second covering layer 15 defines at least one second opening 153 to expose the plurality of second conductive fingers 133.

In the exemplary embodiment, there are two first openings 143 and two second openings 153.

A plurality of first through holes 103 and a plurality of second through holes 104 are defined through the flexible printed circuit board 10.

Each of the plurality of first through holes 103 corresponds to and is defined through one first conductive pad 122. Each of the plurality of second through holes 104 corresponds to and is defined through one second conductive pad 132.

A cross sectional shape of each of the plurality of first through holes 103 and a cross sectional shape of each of the plurality of second through holes 104 are all trapezoidal. Each of the plurality of first through holes 103 and each of the plurality of second through holes 104 have bigger openings on the second covering layer 15 than on the first covering layer 14. A diameter of each of the plurality of first through holes 103 and a diameter of each of the plurality of second through holes 104 decrease along a direction from the second covering layer 15 to the first covering layer 14.

Preferably, a diameter of each of the plurality of first through holes 103 on the first covering layer 14 and a diameter of each of the plurality of second through holes 104 on the first covering layer 14 are in a range from about 5 micrometers to about 15 micrometers.

The flexible printed circuit board 10 defines a plurality of first conductive pillars 105 and a plurality of second conductive pillars 106. Each of the plurality of first conductive pillars 105 corresponds to and is received in one first through hole 103, and each of the plurality of second conductive pillars 106 corresponds to and is received in one second through hole 104.

Each of the plurality of first conductive pillars 105 corresponds to and electrically connects to one first conductive pad 122, and each of the plurality of second conductive pillars 106 corresponds to and electrically connects to one second conductive pad 132. The plurality of first conductive pillars 105 is spaced from the second conductive wire 131. The plurality of second conductive pillars 105 is spaced from the first conductive wire 121. The plurality of first conductive pillars 105 and the plurality of second conductive pillars 106 being exposed from one surface of the flexible printed circuit board 10 form a plurality of electrical contact pads 107.

In the exemplary embodiment, one end of each of the plurality of first conductive pillars 105 and one end of each of the plurality of second conductive pillars 105 are all coplanar to the surface of the second covering layer 15 away from the first covering layer 14, and other end of each of the plurality of first conductive pillars 105 and other end of each of the plurality of second conductive pillars 106 protrude from the surface of the first covering layer 14 away from the second covering layer 15. Protruding portions of the plurality of first conductive pillars 105 and protruding portions of the plurality of second conductive pillars 106 form the plurality of electrical contact pads 107.

In the exemplary embodiment, a diameter of each of the plurality of first conductive pillars 105 and a diameter of each of the plurality of second conductive pillars 106 decreases along a direction from the second covering layer 15 to the first covering layer 14.

In the exemplary embodiment, each height of each of the plurality of first conductive pillars 105 protruding from the surface of the first covering layer 14 and each height of each of the plurality of second conductive pillars 105 protruding from the surface of the first covering layer 14 are in a range from about 2 micrometers to about 10 micrometers.

In other exemplary embodiments, the other end of each of the plurality of first conductive pillars 105 and the other end of each of the plurality of second conductive pillars 105 can be coplanar with or depressed from the surface of the first covering layer 14 away from the second covering layer 15.

In other exemplary embodiments, a plated tin layer (not shown) or a plated gold layer (not shown) can be formed on surfaces of the plurality of electrical contact pads 107, the plurality of first conductive fingers 123, and the plurality of second conductive fingers 133.

In a sixth exemplary embodiment, as shown in FIG. 8, a flexible printed circuit board 10a is illustrated. The flexible printed circuit board 10a in the sixth exemplary embodiment is similar to the flexible printed circuit board 10 in the fifth exemplary embodiment. The differences include a stiffener 16a adhered on the second covering layer 15 to cover at least the mounting area 101, thereby covering one end of each first conductive pillar 105 and one end of each second conductive pillar 106.

The stiffener 16a can be made of metal or resin. When the stiffener 16a is made of resin, it can be made of polyimide, teflon, polyamide, polymethylmethacrylate, polycarbonate, polyethylene terephtalate, polyamide polyethylene-terephthalatecopolymer or any combination.

In a seventh exemplary embodiment, as shown in FIGS. 9-10, a flexible printed circuit board 10b is illustrated. The flexible printed circuit board 10b in the seventh exemplary embodiment is similar to the flexible printed circuit board 10 in the fifth exemplary embodiment. The differences include a plurality of first grooves 17b being defined by removing a portion of each first conductive pillar 105 on the second covering layer 15 side, and a plurality of second grooves 18b being defined by removing a portion of each second conductive pillar 106 on the second covering layer 15 side; the end of each of the plurality of first conductive pillars 105 and the end of each of the plurality of second conductive pillars 106 is depressed from the surface of the second covering layer 15 away from the first covering layer 14; each of the plurality of first grooves 17b is aligned with and corresponds to one first conductive pillar 105, and each of the plurality of second grooves 18b is aligned with and corresponds to one second conductive pillar 106; an insulating radiating material 19b is infilled into the plurality of first grooves 17b and the plurality of second grooves 18b, a stiffener 16b is adhered on the second covering layer 15 to cover at least the mounting area 101, thereby covering insulating radiating material 19b.

The plurality of first grooves 17b and the plurality of second grooves 18b are all defined from the second covering layer 15 to a surface of the second conductive pattern layer 13 away from the first conductive pattern layer 12.

In an eighth exemplary embodiment, as shown in FIGS. 11-12, a flexible printed circuit board 10c is illustrated. The flexible printed circuit board 10c in the eighth exemplary embodiment is similar to the flexible printed circuit board 10b in the seventh exemplary embodiment. The differences include a plurality of third grooves 19b being defined by removing a portion of each first conductive pillar 105 from the surface of the second conductive pattern layer 13 away from the first conductive pattern layer 12 and ending at a surface of the first conductive pattern layer 12 near the second conductive pattern layer 13. Each of the plurality of third grooves 19b is in air communications with one of the plurality of first grooves 17b; an insulating radiating material 19c is infilled into the plurality of first grooves 17b, the plurality of second grooves 18b, and the plurality of third grooves 19b, a stiffener 16c is adhered on the second covering layer 15 to cover at least the mounting area 101, thereby covering the insulating radiating material 19c.

Figure 13:
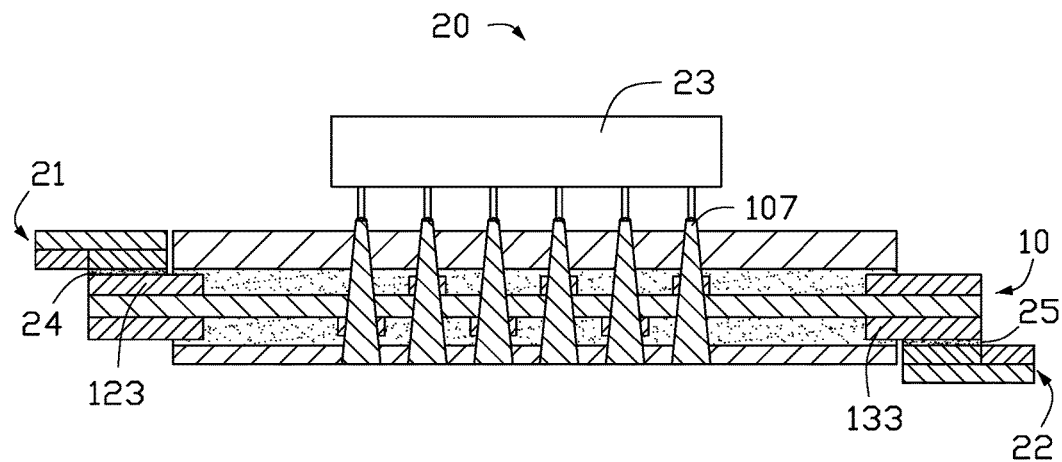
FIG. 13 is a cross-sectional view of a printed circuit structure according to an exemplary embodiment.

In a ninth exemplary embodiment, as shown in FIG. 13, a printed circuit board structure 20 is illustrated. The printed circuit board structure 20 includes a flexible printed circuit board 10 in the fifth exemplary embodiment, a first connecting circuit board 21, a second connecting circuit board 22, and an IC driving wafer 23.

The first connecting circuit board 21 is adhered and electrically connects to a first conductive finger group by an anisotropic conductive film 24. The second connecting circuit board 22 is adhered on and electrically connects to a second conductive finger group by an anisotropic conductive film 25. The IC driving wafer 23 is mounted on and electrically connects to the plurality of electrical contact pads 107.

In other exemplary embodiments, the flexible printed circuit board 10 can also be selected from the flexible printed circuit boards in the sixth to eighth exemplary embodiments.

In other exemplary embodiments, there can be other electronic components mounted on the flexible printed circuit board 10 in addition to the IC driving wafer 23, or the IC driving wafer 23 can be replaced by other electronic components.

A method for forming a rigid-flexible printed circuit board, a rigid printed circuit board, a high density interconnector circuit board, or an IC substrate board can be produced by the methods in the first to fourth exemplary embodiment.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A flexible printed circuit board, comprising:
   a first conductive pattern layer, the first conductive pattern layer comprising a plurality of first conductive pads;
   a second conductive pattern layer, the second conductive pattern layer comprising a plurality of second conductive pads;
   a plurality of first through holes being defined through the flexible printed circuit board, each of the plurality of first through holes corresponding to and being defined through one first conductive pad;
   a plurality of second through holes being defined through the flexible printed circuit board, each of the plurality of second through holes corresponding to and being defined through one second conductive pad;
   a plurality of first conductive pillars, each of the plurality of first conductive pillars corresponding to and being received in one first through hole to electrically connect to one first conductive pad, the plurality of first conductive pillars being spaced from the second conductive pattern layer, and
   a plurality of second conductive pillars, each of the plurality of second conductive pillars corresponding to and being received in one second through hole to electrically connect to one second conductive pad, the plurality of second conductive pillars being spaced from the first conductive pattern layer;

wherein the plurality of first conductive pillars and the plurality of second conductive pillars are exposed from one surface of the flexible printed circuit board to form a plurality of electrical contact pads, a plurality of first grooves and a plurality of second grooves are defined from an outer surface of the flexible printed circuit board on the second conductive pattern layer side to a surface of the second conductive pattern layer away from the first conductive pattern layer; each of the plurality of first grooves is aligned with and corresponds to one first conductive pillar, and each of the plurality of second grooves is aligned with and corresponds to one second conductive pillar.

2. The flexible printed circuit board of claim 1, wherein one exposed end of each of the plurality of first conductive pillars and one exposed end of each of the plurality of second conductive pillars protrude from one side of the flexible printed circuit board.

3. The flexible printed circuit board of claim 1, wherein a diameter of each of the plurality of first conductive pillars and a diameter of each of the plurality of second conductive pillars decrease along a direction from one side of the flexible printed circuit board to an opposite side of the flexible printed circuit board.

4. The flexible printed circuit board of claim 1, wherein a stiffener is adhered on a side of the flexible printed circuit board, to cover one end of each first conductive pillars and one end of each second conductive pillars.

5. The flexible printed circuit board of claim 1, wherein an insulating radiating material is infilled into the plurality of first grooves and the plurality of second grooves, and a stiffener is adhered on the surface of the flexible printed circuit board to cover the insulating radiating material.

6. The flexible printed circuit board of claim 1, wherein a plurality of third grooves are defined from the surface of the second conductive pattern layer away from the first conductive pattern layer to a surface of the first conductive pattern layer near the second conductive pattern layer, each of the plurality of third grooves corresponds to and is in air communication with one of the plurality of first grooves.

7. The flexible printed circuit board of claim 6, wherein an insulating radiating material is infilled into the plurality of first grooves, the plurality of second grooves and the plurality of third grooves, and then a stiffener is adhered on the surface of the flexible printed circuit board to cover the insulating radiating material.

8. A printed circuit board structure, comprising:
a flexible printed circuit board, comprising:
a first conductive pattern layer, the first conductive pattern layer comprising a plurality of first conductive pads;
a second conductive pattern layer, the second conductive pattern layer comprising a plurality of second conductive pads;
a plurality of first through holes being defined through the flexible printed circuit board, each of the plurality of first through holes corresponding to and being defined through one first conductive pad;
a plurality of second through holes being defined through the flexible printed circuit board, each of the plurality of second through holes corresponding to and being defined through one second conductive pad;
a plurality of first conductive pillars, each of the plurality of first conductive pillars corresponding to and being received in one first through hole to electrically connect to one first conductive pad, the plurality of first conductive pillars being spaced from the second conductive pattern layer, and
a plurality of second conductive pillars, each of the plurality of second conductive pillars corresponding to and being received in one second through hole to electrically connect to one second conductive pad, the plurality of second conductive pillars being spaced from the first conductive pattern layer;

wherein the plurality of first conductive pillars and the plurality of second conductive pillars are exposed from one surface of the flexible printed circuit board to form a plurality of electrical contact pads, a plurality of first grooves and a plurality of second grooves are defined from an outer surface of the flexible printed circuit board on the second conductive pattern layer side to a surface of the second conductive pattern layer away from the first conductive pattern layer; each of the plurality of first grooves is aligned with and corresponds to one first conductive pillar, and each of the plurality of second grooves is aligned with and corresponds to one second conductive pillar; and at least one electronic component mounted on the plurality of electrical contact pads.

9. The printed circuit board structure of claim 8, wherein one exposed end of each of the plurality of first conductive pillars and one exposed end of each of the plurality of second conductive pillars protrude from one side of the flexible printed circuit board.

10. The printed circuit board structure of claim 8, wherein a diameter of each of the plurality of first conductive pillars and a diameter of each of the plurality of second conductive pillars decrease along a direction from one side of the flexible printed circuit board to an opposite side of the flexible printed circuit board.

11. The printed circuit board structure of claim 8, further comprising at least one connecting circuit board, and the flexible printed circuit board further comprising a plurality of conductive fingers; wherein the at least one connecting circuit board is adhered on and electrically connects to the plurality of conductive fingers by at least one anisotropic conductive film.

* * * * *